United States Patent [19]

Carpenter

[11] Patent Number: 5,128,568
[45] Date of Patent: Jul. 7, 1992

[54] SELF-BIASING TIMING CIRCUIT FOR ACHIEVING LONG TIME DELAYS

[75] Inventor: Gary D. Carpenter, Lexington, Ky.

[73] Assignee: International Business Machines Corp., Armonk, N.Y.

[21] Appl. No.: 592,156

[22] Filed: Oct. 3, 1990

[51] Int. Cl.[5] .................. H03K 5/159; G11B 21/02
[52] U.S. Cl. .................................. 307/590; 307/597; 307/603; 307/605; 328/55; 360/75
[58] Field of Search .............. 307/590, 595, 597, 602, 307/603, 605; 328/55; 360/75

[56] References Cited

U.S. PATENT DOCUMENTS

| | | | |
|---|---|---|---|
| 4,237,501 | 12/1980 | Barmache | 360/75 |
| 4,311,948 | 1/1982 | Brown | 318/759 |
| 4,591,745 | 5/1986 | Shen | 307/597 |
| 4,658,308 | 4/1987 | Sander | 360/74.1 |
| 4,985,646 | 1/1991 | Kumagai et al. | 307/603 |

*Primary Examiner*—Stanley D. Miller
*Assistant Examiner*—Trong Phan
*Attorney, Agent, or Firm*—John J. McArdle; William H. Steinberg

[57] ABSTRACT

A timing circuit in which an output can be held at a certain level or state for a particular time after the circuit is enabled. The time is established by an external resistor and capacitor. The timing circuit is self-biasing to permit operation after associated power supplies have dropped to zero. The timing of the circuit is independent of supply voltage and substantially independent of temperature variations. The timing circuit includes a number of MOSFET's which are diode connected between two nodes, and another MOSFET having a gate and one conduction electrode connected across the two nodes. The voltage between the two nodes at the beginning of the timing interval is the sum of the threshold voltages of the diode connected MOSFET's. At the end of the timing interval, the voltage between the two nodes has fallen to the threshold voltage of the single MOSFET. The timing interval is therefore dependent upon the discharge rate set by the external resistor and capacitor and the ratio of the sum of the threshold voltages of the plurality of MOSFET's to the threshold voltage of the single MOSFET. Relatively long time intervals can be achieved using this circuit with standard surface mount components for the resistor and capacitor. The circuit finds particular use in a disk drive in which a head actuator must be braked for a period of time and then retracted, with the period of time determined in an environment where the disk drive power supplies are falling to zero.

9 Claims, 2 Drawing Sheets

SELF-BIASING TIMING CIRCUIT FOR ACHIEVING LONG TIME DELAYS

FIELD OF THE INVENTION

This invention relates generally to timing circuits and more particularly concerns a self-biasing timing circuit. The invention is disclosed in relation to a disk drive system in which the timing circuit is employed to set the brake time in a brake and retract sequence for the head actuator of the disk drive.

BACKGROUND OF THE INVENTION

Many timing circuits are known, such as those in which an initial voltage is permitted to decay to a lower set point voltage, with a comparator detecting when the set point voltage has been reached. Such timing circuits have dependencies upon system power supplies so that variations in a supply will affect the detected time interval; or a loss of a power supply voltage may render the timing circuit inoperative.

Some such timing circuits suffer timing inaccuracies due to temperature variations of the circuit components or differences in device characteristics from circuit to circuit.

It is the general aim of the invention to provide a timing circuit which overcomes, or greatly reduces the effect of, the foregoing disadvantages.

SUMMARY OF THE INVENTION

This objective has been accomplished in accordance with certain principles of the invention by the provision of a self-biasing timing circuit capable of setting a time interval independent of supply voltage.

In one form of the invention, a starting point voltage is established by the sum of the threshold voltages of a number of diode connected field effect transistors; and this voltage is applied to the gate of a field effect transistor. As the starting point voltage decays through an RC network, the single transistor is held conductive until the voltage falls to the threshold voltage of that transistor. The time interval is settable based upon the discharge rate of the RC network and the ratio of the sum of the threshold voltages of the diode connected transistors to the threshold voltage of the single transistor.

If the transistors are in close proximity and of the same type, temperature effects on the timing are minimal, and if the transistors are, for example, integrated MOSFET's, not only are temperature effects minimized, but there is also some process independence since the devices are all formed on the same substrate, at the same time, etc.

As shall be described hereinafter with regard to a particular form of the invention, the timing circuit may be advantageously included in a disk drive system in which accurate time intervals are needed in an environment in which power supplies are falling to zero.

Other objects and advantages of the invention, and the manner of their implementation, will become apparent upon reading the following detailed description and upon reference to the drawings in which:

DETAILED DESCRIPTION

Figure 1:
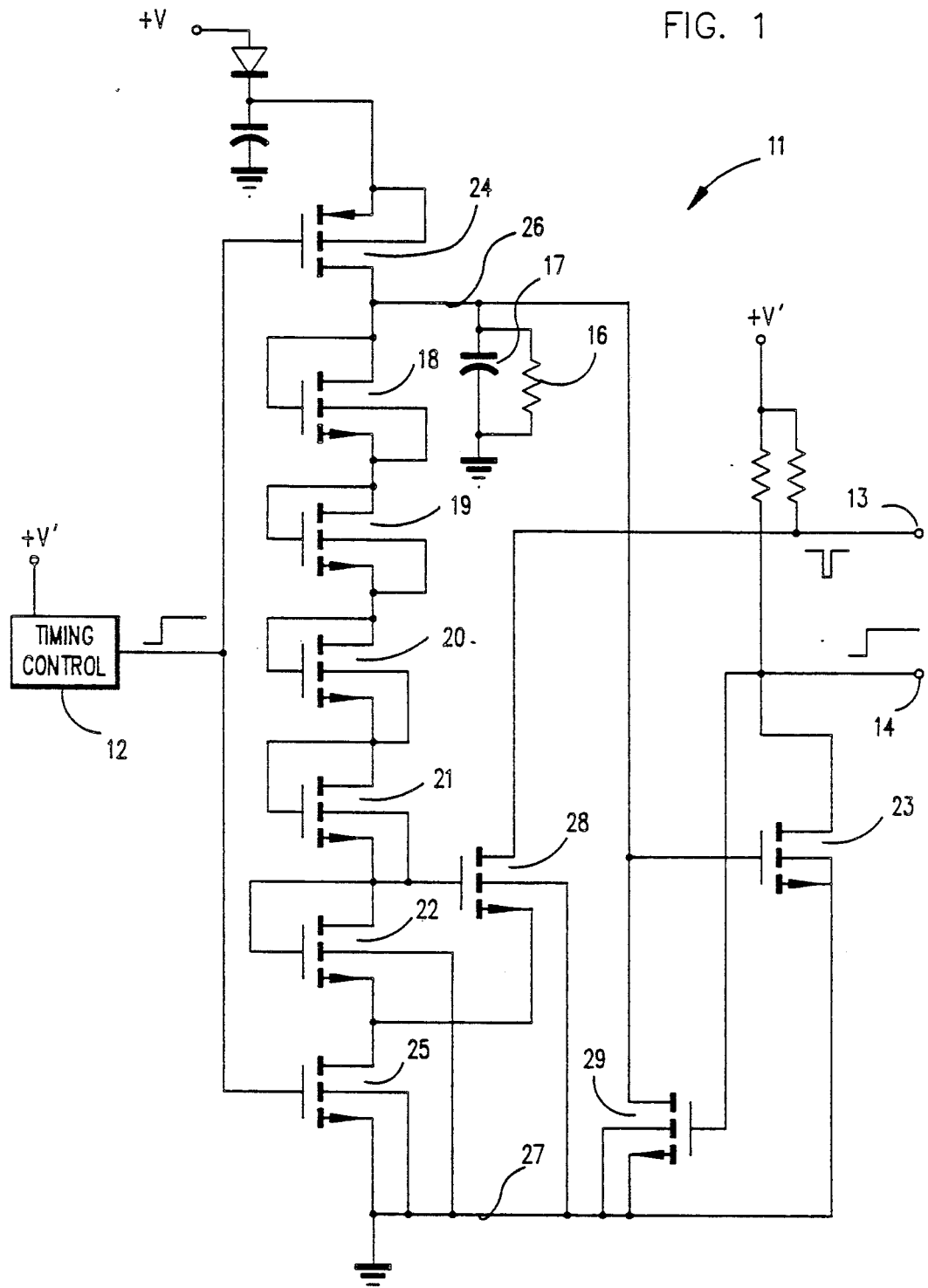
FIG. 1 is a circuit diagram of a timing circuit in accordance with the present invention.

While the invention is susceptible to various modifications and alternative forms, a specific embodiment thereof has been shown by way of example in the drawings and will herein be described in detail. It should be understood, however, that it is not intended to limit the invention to the particular form disclosed, but, on the contrary, the intention is to cover all modifications, equivalents, and alternatives falling within the spirit and scope of the invention, as defined by the appended claims.

With initial reference to FIG. 1, a timing circuit 11 receives a signal to begin a timing sequence from a timing control circuit 12 and produces an output signal signifying the beginning of the timing interval at a terminal 13 and a signal indicating the end of the timing interval at a terminal 14. The length of the timing interval, from beginning to end, is substantially determined by an RC network made up of a resistor 16 and a capacitor 17 and the ratio of the sum of the threshold voltages of a series of diode connected transistors 18-22 to the threshold voltage of a transistor 23.

When the output of the timing control 12 transitions from low to high, a transistor 24 at the top of the series of transistors 18-22 is turned off, and a transistor 25 at the bottom of the series of transistors is turned on. This removes the supply voltage from a node 26 at the top of the series of transistors and connects the series of transistors to a node 27, which is connected to ground.

Prior to the signal from the timing control 12, a positive supply voltage +V is coupled through the transistor 24, which is a PMOS field effect transistor, maintaining a supply voltage on the capacitor 17 and the node 26. This voltage is higher than the sum of the threshold voltages of the transistors 18-22. The voltage at the node 26, prior to the timing control signal, also turns on the transistor 23, maintaining the output at the terminal 14 low. The transistor 23, the transistors 25, 28 and 29, and the transistors 18-22 are NMOS field effect transistors.

When the signal from the timing control circuit 12 is received, the transistor 25 is turned on, connecting the bottom of the series of transistors 18-22 to ground. The voltage on the node 26 drops rapidly to the level of the sum of the threshold voltages of the transistors 18-22 in response to the turning on of the transistor 25 and the turning off of the transistor 24. The current flow through the series of transistors to bring the voltage on the node 26 down to this level results in current flow through the transistors, including the transistor 22. The current flow through the transistor 22 results in current flow through a transistor 28 so that the voltage on the terminal 13 pulses low. After the brief current flow through the series of resistors 18-22, the voltage at the terminal 13 returns high, with the transistor 28 once again becoming non-conductive.

A pull-up voltage is applied to the terminals 13 and 14 from a supply +V', which remains operative during the timing sequence. The supply V' can be produced from a supply having sufficient energy storage capacity, and small enough current loading, to survive through the timing interval. In the case of a disk drive, the supply can be provided by tapping energy from the spindle motor of the disk drive. The V' supply is also used by the timing control circuit 12. In the illustrated circuit, the supply V coupled to the transistor 24 need only be present at the beginning of the timing interval and is then not required.

After the potential between the node 26 and the node 27 has fallen to a value equal to the sum of the threshold voltages of the transistors 18-22, and after the pulse has appeared at the terminal 13, the capacitor 17 begins to discharge through the resistor 16, following the equation:

$$v(t)=5(V_T)exp(-t/(R16)(C17))-(I_{BIAS}/C17)t \qquad (1)$$

In this equation, it is assumed that the transistors 18-22 and 23 have the same threshold voltage, which is true if the devices are matched, or more particularly if the transistors 18-22 and the transistor 23 are integrated on the same substrate.

In the equation, $I_{BIAS}$ is the bias current required by the timing circuit. Since the transistor 29 and the transistor 24 are off and the voltage at the node 26 v(t) is below $5V_T$ after the beginning of the timing interval, the devices 18-22 are also off. Thus, the bias current required is only the leakage current of the devices 18-22 and the gate of the transistor 23, which is very small. Therefore, the timing equation can be simplified by the elimination of the second term involving the bias current.

During the timing interval, the voltage at the node 26 decays exponentially from $5V_T$ until it drops to the threshold voltage $V_T$ of the transistor 23. At this time, the voltage at the terminal 14 is released since it is no longer held low by the transistor 23. As the voltage begins to rise at the terminal 14, this turns on the transistor 29, which provides turn off gain for turning off the transistor 23, sharpening the turn off edge.

Setting v(t) equal to $V_T$, and solving equation (1) for t, the timing interval for the circuit can be determined. The value of t is $-R16 \times C17 \times \ln(1/5)$. In the general case, the time interval is the product of the resistance of the resistor 16, the capacitance of the capacitor 17, and the natural log of the number of devices in the series of devices, such as the transistors 18-22.

The timing circuit 11 provides a delay time which is dependent upon R16, C17, and a multiplying factor determined by the number of devices in series in the circuit. The accuracy of the device ratio is determined by the matching of similar components and, in integrated circuit form, the ratio should also track well with temperature. In the general case, the ratio is the sum of the threshold voltages of the series of devices serving the function of the transistors 18-22 to the threshold voltage of the device or devices serving the function of the transistor 23.

Using the disclosed timing circuit and standard values of surface mount components for the resistor 16 and the capacitor 17 provides a relatively long time interval. For example, if the resistor 16 is one Megohm and the capacitor 17 is 0.1 uF, the delay time is about 160 msec. The value of the natural logarithm factor can be changed, for example, by altering the number of devices in the series string between the nodes.

The voltage V' pulling up the outputs 13 and 14 need only persist long enough for detectable signals to be produced at those terminals. As indicated earlier, the voltage V is not needed after the beginning of the timing operation. The timing circuit is supply independent since the beginning point and ending point for the voltage on the node 26 is dependent upon the threshold voltages of the devices and not upon power supply values.

Figure 2:
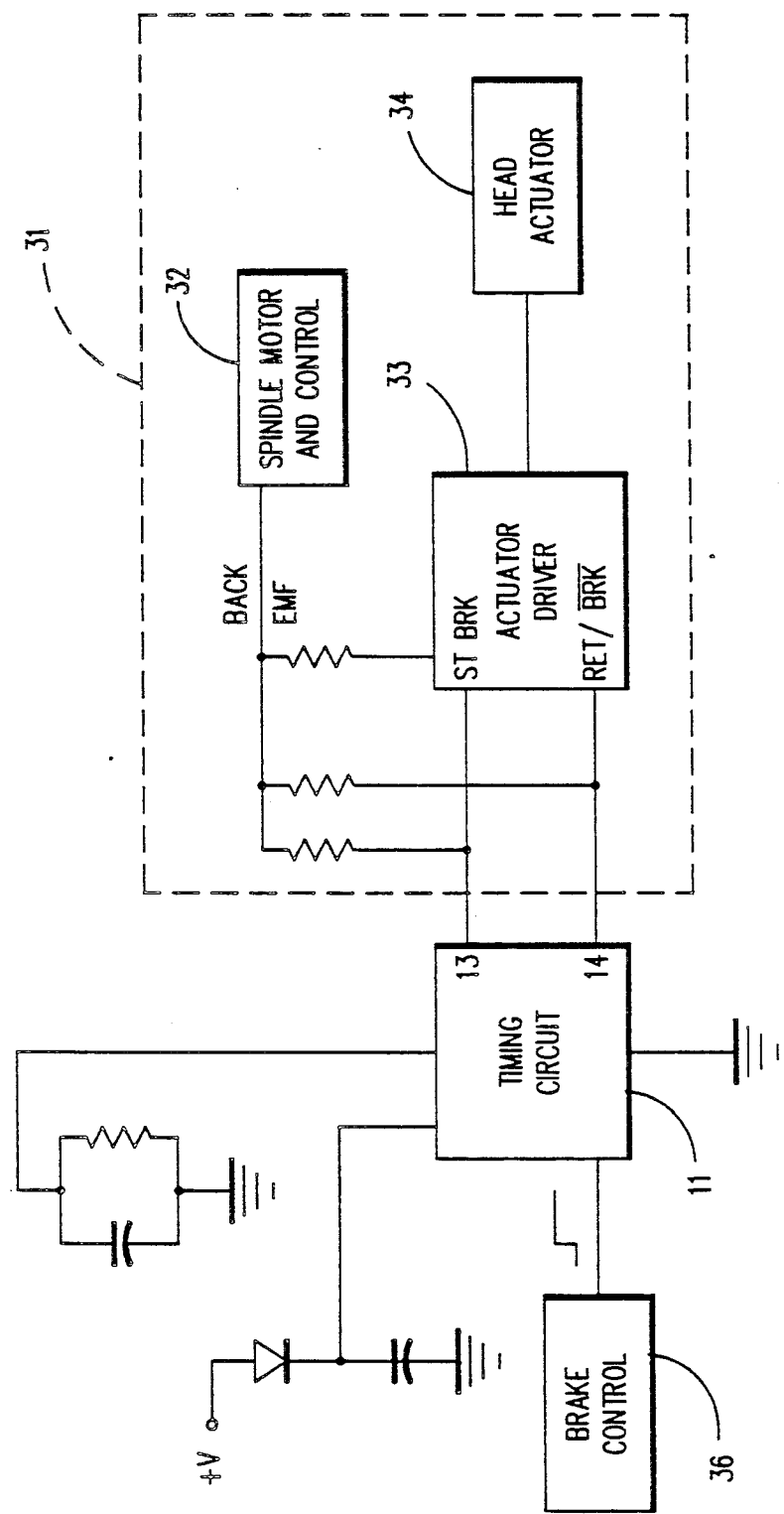
FIG. 2 is a diagrammatic illustration of a disk drive system incorporating the timing circuit of FIG. 1.

With reference now to FIG. 2, a disk drive system 31, exclusive of the present timing circuit 11 which is shown separately, includes, in relevant part for the present invention, a spindle motor and related control 32, a head actuator driver 33, and a head actuator 34. The timing circuit 11 receives a brake control signal from a brake control 36, comparable to the timing control 12 of FIG. 1. The timing circuit 11 responds to the brake control signal in the manner described with regard to FIG. 1 to produce a "start brake" signal at the terminal 13 and a "retract"/"stop brake" signal at the terminal 14. The actuator driver 33 responds to the brake signal from the terminal 13 of the timing circuit 11 to begin braking the head actuator motor to stop the movement of the disk drive head. After the timing interval established by the timing circuit 11, which may be for example 50 msec., the timing signal is provided at the terminal 14 to the actuator driver 33. The driver 33 responds to the signal from the terminal 14 to end the braking cycle and to apply energy to retract the head. The energy to retract the disk drive head is provided from the back EMF of the spindle motor. The pull-up supplies for the terminal 13 and 14 are also provided from the back EMF of the spindle motor in the illustrated system. Energy can be supplied from the spindle motor for a sufficient time to permit retraction of the head before the spindle motor is braked. This time before braking the spindle motor may also be timed using a timing circuit similar to the circuit 11.

What is claimed is:

1. A self-biasing timing circuit comprising:
   a plurality n of transistors which are diode connected in series and coupled between a first node and a second node;
   means for storing energy connected between the first and second nodes;
   means for supplying electrical energy to the first node before the beginning of timing interval to charge said means for storing energy;
   a discharge path substantially setting a discharge rate for the first node during the timing interval;
   a transistor having a control electrode, a first conduction electrode and a second conduction electrode, said control electrode coupled to the first node and the first conduction electrode coupled to the second node, the difference in electrical potential between the first node and the second node at the beginning of the timing interval being substantially equal to the sum of the threshold voltages of the plurality n of transistors, the difference in electrical potential between the first and second node being greater than the threshold voltage of the transistor so that the transistor is conductive;
   means connected to the second conduction electrode for supplying electrical energy to the second conduction electrode of the transistor to produce an electrical potential at the second conduction electrode of the transistor relative to the first conduction electrode of the transistor; and
   means for beginning a timing interval by removing the supply of energy to the first node to set the difference in electrical potential between the first node and the second node to substantially the sum of the threshold voltages of the plurality n of transistors, so that during the discharge interval the discharge rate of the first node relative to the second node is substantially set by the discharge path and the discharge time is proportional to the discharge rate and the ratio of the sum of the threshold voltages of the plurality n of transistors to the threshold voltage of the transistor, the end of the timing interval occurring when the electrical potential between the first node and the second node reaches the threshold voltage of the transistor and the transistor turns off, so that an increased potential begins to appear between the conduction electrodes of the transistor.

2. The timing circuit of claim 1 in which the transistor is a field effect transistor.

3. The timing circuit of claim 1 in which the plurality n of transistors and the transistor are integrated MOSFET's.

4. The timing circuit of claim 1 which further comprises means for latching the transistor in a non-conductive state when the electrical potential between the first node and the second node falls below the threshold voltage of the transistor said means for latching having means for connecting said first and second nodes to one another and a control electrode responsive to the voltage on said transistor second conduction electrode.

5. A self-biasing timing circuit comprising:
a first node and a second node;
means for supplying electrical energy to at least one of the nodes before the beginning of a timing interval to establish an electrical potential difference between the nodes;
means connected between the first and second nodes for establishing an initial electrical potential between the first node and the second node when the supply of electrical energy is removed;
a discharge path connected between the first and second nodes substantially setting discharge rate for the first node relative to the second node during the timing interval;
a switch having a high impedance control electrode coupled to the first node, a first conduction electrode coupled to the second node, and a second conduction electrode, the difference in electrical potential between the first node and the second node at the beginning of timing interval being substantially equal to the initial electrical potential, the difference in electrical potential between the first and second nodes being greater than the threshold voltage necessary to maintain the switch in a conductive state where the first conduction electrode is coupled to the second conduction electrode;
means connected to the second conduction electrode for supplying electrical energy to the second conduction electrode of the switch to produce an electrical potential at the second conduction electrode of the switch relative to the first conduction electrode of the switch, when the switch is not in the conductive state; and
means for beginning a timing interval by removing the supply of electrical energy to set the difference in electrical potential between the fist node and the second node to substantially the initial electrical potential, so that during the discharge interval the discharge rate of the first node relative to the second node is substantially set by the discharge path and the discharge time is proportional to the discharge rate and the ratio of the initial electrical potential to the threshold voltage of the switch, the end of the timing interval occurring when the electrical potential between the first node and the second node reaches the threshold voltage of the switch means, so that an increased potential begins to appear between the conduction electrodes of the switch when the switch leaves the conductive state.

6. A disk drive system comprising:
a disk head actuator;
a driver circuit coupled to said disk head actuator for driving said disk head actuator, including means for braking and retracting the actuator; and
timing circuit means comprising
a switching means;
a plurality n of transistors which are diode connected in series and coupled between a first node and through said switching means to a second node;
means for storing energy connected between the first and second nodes;
means for supplying electrical energy to the first node before the beginning of a timing interval to charge said means for storing energy and causing said switching means to be nonconductive;
a discharge path substantially setting a discharge rate for the first node during the timing interval;
a transistor having a control electrode, a first conduction electrode and a second conduction electrode, said control electrode coupled to the first node and the first conduction electrode coupled to the second node, the difference in electrical potential between the first node and the second node at the beginning of the timing interval being substantially equal to the sum of the threshold voltages of the plurality n of transistors, with the difference in electrical potential between the first and second node being greater than the threshold voltage of the transistor so that the transistor is conductive;
means connected to the second conduction electrode for supplying electrical energy to the second conduction electrode of the transistor to produce an electrical potential at the second conduction electrode of the transistor relative to the first conduction electrode of the transistor; and
means for beginning a timing interval of a brake and retract sequence during which the driver circuit brakes the disk head actuator by removing the supply of energy to the first node and causing said switching means to be conductive to set the difference in electrical potential between the first node and the second node to substantially the sum of the threshold voltages of the plurality n of transistors, so that during the discharge interval the discharge rate of the first node relative to the second node is substantially set by the discharge path and the discharge time is proportional to the discharge rate and the ratio of the sum of the threshold voltages of the plurality n of transistors to the threshold voltage of the transistor, the end of the timing interval effects the end of the braking of the actuator and the beginning of retraction of the head actuator by said driver circuit and occurring when the electrical potential between the first node and the second node reaches the threshold voltage of the transistor and the transistor turns off, so that an increased potential begins to appear between the conduction electrodes of the transistor.

7. The disk drive system of claim 6 wherein each of said plurality of n transistors has a control electrode, said disk drive system further comprising a start transistor having a control electrode and a first and second conduction electrodes, said control electrode of said start transistor connected to the control electrode of said one of said plurality n of transistors which is connected to said switching means, said first conduction electrode of said start transistor connected to said switching means, so that when said one said plurality of a switching means is conductive said start transistor is conductive, said second conduction electrode of said start transistor connected to said means for supplying electrical energy to the second conduction electrode of the transistor, so that said start transistor provides a signal at its second conduction electrode indicative of the start of the braking interval.

8. A self-biasing circuit comprising:
   a switching means;
   a plurality n of transistors which are diode connected in series and coupled between a first node and through said switching means to a second node;
   means for storing energy connected between the first and second nodes;
   means for supplying electrical energy to the first node before the beginning of a timing interval to charge said means for storing energy and causing said switching means to be nonconductive;
   a discharge path substantially setting a discharge rate for the first node during the timing interval;
   a transistor having a control electrode, a first conduction electrode and a second conduction electrode, said control electrode coupled to the first node and the first conduction electrode coupled to the second node, the difference in electrical potential between the first node and the second node at the beginning of the timing interval being substantially equal to the sum of the threshold voltages of the plurality n of transistors, with the difference in electrical potential between the first and second node being greater than the threshold voltage of the transistor so that the transistor is conductive;
   means connected to the second conduction electrode for supplying electrical energy to the second conduction electrode of the transistor to produce an electrical potential at the second conduction electrode of the transistor relative to the first conduction electrode of the transistor; and
   means for beginning a timing interval by removing the supply of energy to the first node and causing said switching means to be conductive to set the difference in electrical potential between the first node and the second node to substantially the sum of the threshold voltages of the plurality n of transistors, so that during the discharge interval the discharge rate of the first node relative to the second node is substantially set by the discharge path and the discharge time is proportional to the discharge rate and the ratio of the sum of the threshold voltages of the plurality n of transistors to the threshold voltage of the transistor, the end of the timing interval occurring when the electrical potential between the first node and the second node reaches the threshold voltage of the transistor and the transistor turns off, so that an increased potential begins to appear between the conduction electrodes of the transistor.

9. The timing circuit of claim 8 wherein each of said plurality of n transistors has a control electrode, said timing circuit further comprising a start transistor having a control electrode and a first and second conduction electrodes, said control electrode of said start transistor connected to the control electrode of said one of said plurality n of transistors which is connected to said switching means, said first conduction electrode of said start transistor connected to said switching means, so that when said one said plurality of a switching means is conductive said start transistor is conductive, said second conduction electrode of said start transistor connected to said means for supplying electrical energy to the second conduction electrode of the transistor, so that said start transistor provides a signal at its second conduction electrode indicative of the start of the timing interval.

* * * * *